(12) United States Patent
Ming-Hsun et al.

(10) Patent No.: US 6,492,828 B2
(45) Date of Patent: Dec. 10, 2002

(54) SYSTEM AND METHOD FOR DETECTING BONDING STATUS OF BONDING WIRE OF SEMICONDUCTOR PACKAGE

(75) Inventors: Lee Ming-Hsun, Tantzu (TW); Chen Chin-Te, Tunshau (TW)

(73) Assignee: Siliconware Precision Industries (TW)

( * ) Notice: Subject to any disclaimer, the term of this patent is extended or adjusted under 35 U.S.C. 154(b) by 0 days.

(21) Appl. No.: 09/801,404

(22) Filed: Mar. 7, 2001

(65) Prior Publication Data

US 2002/0053920 A1 May 9, 2002

(30) Foreign Application Priority Data

Nov. 7, 2000 (TW) .......................... 089123513

(51) Int. Cl.⁷ ................ G01R 31/02; B23K 1/06
(52) U.S. Cl. ............ 324/763; 324/158.1; 228/103; 228/110.1; 228/180.5
(58) Field of Search ................. 324/765, 763, 324/537, 538, 158.1; 228/4.5, 8–10, 180.5, 103, 110.1

(56) References Cited

U.S. PATENT DOCUMENTS

| | | | | |
|---|---|---|---|---|
| 4,586,642 A | * | 5/1986 | Dreibelbis et al. | 228/104 |
| 5,156,319 A | * | 10/1992 | Shibasaka et al. | 228/104 |
| 5,712,570 A | | 1/1998 | Heo et al. | |
| 5,893,508 A | | 4/1999 | Oh | |

* cited by examiner

*Primary Examiner*—Michael Sherry
*Assistant Examiner*—Tung X. Nguyen
(74) *Attorney, Agent, or Firm*—Klarquist Sparkman, LLP

(57) ABSTRACT

The present invention provides schemes which are associated with wire bonding process or wire bonding machine to detect the bonding status of a bonding wire of a package including at least a semiconductor unit. The schemes are very useful to a BGA (Ball Grid Array) package or similar types of packages, and provide significant advantages particularly for a package in which the resistance (such as the resistance resulting from an adhesion layer and a layer of Cupric Oxide for promoting adhesion) between a semiconductor unit and its carrier is not low enough. The present invention is characterized in that a preset connection between a semiconductor unit and a package-connection-area (such as the solder ball pad of a ball grid array package) is established in the beginning of a wire bonding process, and the package-connection-area is electrically connected with a press plate used by the wire bonding machine or the wire bonding process, so that a current loop can be formed via a bonding wire, the preset connection, the package-connection-area, and the press plate when the bonding wire is bonded to a semiconductor unit, and the bonding status between the bonding wire and the semiconductor unit can be indicated according to the current flowing through the current loop. The present invention is also applicable to the detection of bonding status between a bonding wire and a bonding finger electrically connected to a package-connection-area of the package.

15 Claims, 3 Drawing Sheets

SYSTEM AND METHOD FOR DETECTING BONDING STATUS OF BONDING WIRE OF SEMICONDUCTOR PACKAGE

FIELD OF THE INVENTION

The present invention generally relates to schemes for detecting bonding status of a bonding wire of a semiconductor package, particularly a package in which the resistance resulting from the adhesion layer and Cupric Oxide layer between the semiconductor unit (such as a chip or die) and its carrier is not low enough for forming a current loop.

BACKGROUND OF THE INVENTION

The electrical connection status between a bonding wire and a semiconductor unit as well as that between the bonding wire and a solder ball pad in a package shall always be checked to see if it is good after wire bonding process. As shown in FIG. 1, after bonding wire 35 was bonded to a bonding pad 6 (or called wire bonding pad) of a semiconductor unit 1 to make an electrical connection between the bonding wire 35 and the semiconductor unit 1, it is bonded to bonding finger 10, which is followed by cutting off the bonding wire 35 at a proper position (such as the location slightly left to the point 18 in the figure), so that the capillary 24 of wire bonding machine may continue bonding another bonding wire to another wire bonding pad of semiconductor unit 1. After capillary 24 completes bonding wire bonding pad 6 by bonding wire 35, wire bonding machine applies an electrical potential difference between bonding wire 35 and a press plate 14, thereby a current is expected to flow through bonding wire 35 (the part between capillary 24 and bonding pad 6), bonding pad 6, semiconductor unit 1, conductive adhesion layer 2, heat dissipater 3, and hot plate 14 back to the wire bonding machine to form a loop current (the direction shown by arrows 45, 46, and 47 is a possible current flowing direction). In case the bonding status between bonding wire 35 and bonding pad 6 is not good, the loop current will be very small or negligible as a result of bad electrical connection between bonding wire 35 and wire bonding pad 6. A normal loop current resulting from normal bonding status will thus be indicative of the good bonding status (good electrical connection) between bonding wire 35 and semiconductor unit 1.

Shown in FIG. 2 is a conventional art in which a layer 4 of Cupric Oxide is coated on a surface of heat dissipater 3 in order to enhance the adhesive force between heat dissipater 3 and semiconductor unit 1, encapsulant body, as well as substrate 7, resulting in the infeasibility of forming the loop current because the layer 4 of cupric oxide is nonconductive. This is why the current direction represented by arrow 47 of FIG. 1 does not exist in FIG. 2, leading to the extreme difficulty of detecting the bonding status (or called electrical connection status) between bonding wire and semiconductor unit in a package, particularly during wire bonding process.

Although the arts disclosed by U.S. Pat. Nos. 5,712,570 and 5,893,508 are also used for detecting the bonding status of bonding wire in a semiconductor package, they are subject to a condition: chip and its carrier or some devices on its carrier form a conductive path for a current loop, therefore these arts cannot be applicable to the case illustrated in FIG. 2 where the layer 4 of Cupric Oxide or the adhesion layer 2 is not electrically conductive. The present invention is thus developed to resolve the problem resulting from either the nonconductive layer of Cupric Oxide or the nonconductive adhesion layer, and thereby to provide convenience for related industries to take advantage of the benefit of the layer of Cupric Oxide, while still be able to detect the bonding status of a bonding wire when packaging a Ball Grid Array package or similar types of packages, leading to more convenient, more systematic, and more flexible operation for detecting the bonding status of bonding wires in a semiconductor package, particularly during wire bonding process.

SUMMARY OF THE INVENTION

An object of the present invention is to provide a method associated with a wire bonding machine or a wire bonding process, for detecting bonding status of a bonding wire of a Ball Grid Array package or similar types of packages (such as those with solder ball pads thereof located on the same surface of a substrate as are semiconductor units thereof), the method achieving more convenient, more systematic, more flexible or less confined (allows the existence of insulation between semiconductor unit and its carrier, for example) schemes for detecting bonding status of a bonding wire, particularly for detecting abnormal bonding status during wire bonding process in order to make up it early enough.

Another object of the present invention is to provide a system associated with a wire bonding machine or a wire bonding process, for detecting bonding status of a bonding wire of a Ball Grid Array package or similar types of packages (such as those with solder ball pads thereof located on the same surface of a substrate as are semiconductor units thereof), the system achieving more convenient, more systematic, more flexible or less confined (allows the existence of insulation between semiconductor unit and its carrier, for example) schemes for detecting bonding status of a bonding wire, particularly for detecting abnormal bonding status during wire bonding process in order to make up it early enough.

A further object of the present invention is to provide the industries related to Ball Grid Array package or similar types of packages, with the convenience or flexibility of selecting, according to individual requirements or conditions, proper schemes for detecting the bonding status of bonding wires of a package. For example, it provides convenience or flexibility of selecting from among the three schemes: only detecting the bonding status between bonding wire and semiconductor unit, only detecting the electrical connection status between bonding wire and solder ball pad, and detecting both the above.

The present invention may be represented by a system associated with a wire bonding process, for detecting bonding status of at least a bonding wire of a package including at least a semiconductor unit and at least a package-connection-means such as solder ball pad. The system primarily comprises: at least a carrier such as a substrate, a heat dissipater, or a piece of tape, or any object capable of supporting the semiconductor unit and/or package-connection-means; at least an electrical conduction means such as an object made of electrically conductive metal, or electrically conductive rubber, or anisotropically conductive film, or the combination of these material, the electrical conduction means contacting at least a selected one of the package-connection-means; at least a preset connection means such as an electrical connection system (an electric wire or a system composed of a trace, a bonding finger, and a bonding wire, for example) established in the beginning of the wire bonding process, for electrically connecting the selected one of the package-connection-means and the semiconductor unit; a voltage source which may be a direct or alternate source or a capacitor, for providing an electrical potential difference between the electrical conduction means and the bonding wire; and a detector such as a current meter, for measuring, when the bonding wire is so bonded (by the wire bonding process, for example) as to electrically connect at least one of the semiconductor unit and the package-connection-means, a current passing the voltage source, and for providing, according to the measured current, at least a status indicating signal reflecting the bonding status (or electrical connection status) between the bonding wire and the semiconductor unit, and/or the bonding status (or electrical connection status) between the bonding wire and a component which may be a bonding finger on the carrier supporting the package-connection-means, and which electrically connects the package-connection-means via the carrier (a trace on the carrier, for example) supporting the package-connection-means.

The present invention may also be represented by a method associated with a wire bonding machine, for detecting bonding status of a bonding wire of a package including at least a semiconductor unit and at least a package-connection-means such as solder ball pad, wherein the semiconductor unit and the package-connection-means are supported by at least a carrier with the wire bonding pads of the semiconductor unit exposed. The method may comprise the steps of: selecting at least one of the package-connection-means such as sold ball pads to be contacted by an electrical conduction means such as an object made of electrically conductive metal, or electrically conductive rubber, or anisotropically conductive film, or the combination of these material; electrically connecting the semiconductor unit and the selected one of the package-connection-means; letting a press plate of the wire bonding machine contact the electrical conduction means; using a voltage source to provide an electrical potential difference which exists between the press plate and the bonding wire when the wire bonding machine completes bonding the bonding wire to the semiconductor unit; measuring a current passing the voltage source, and providing a status indicating signal according to the measured current to reflect the bonding status between the bonding wire and the semiconductor unit. An embodiment of the above step of electrically connecting the semiconductor unit and the selected one of the package-connection-means may be to bond a wire to the semiconductor unit and a bonding finger connecting the package-connection-means via a trace of the carrier supporting the package-connection-means.

The present invention may further be represented by a second method also associated with a wire bonding machine, for detecting bonding status of a bonding wire of a package including at least a semiconductor unit and at least a package-connection-means such as solder ball pad, wherein the semiconductor unit and the package-connection-means are supported by at least a carrier with the wire bonding pads of the semiconductor unit exposed. The second method may comprise the steps of: contacting all of the package-connection-means by an electrical conduction means such as an object made of electrically conductive metal, or electrically conductive rubber, or anisotropically conductive film, or the combination of these material; selecting at least one of the package-connection-means to electrically connect the semiconductor unit; letting a press plate of the wire bonding machine contact the electrical conduction means; using a voltage source to provide an electrical potential difference which exists between the press plate and the bonding wire when the wire bonding machine completes bonding the bonding wire to the semiconductor unit, and also exists when the wire bonding machine completes bonding the bonding wire to a component (a bonding finger of the carrier supporting the package-connection-means, for example) electrically connecting the package-connection-means; and measuring twice the current passing the voltage source, and providing a first status indicating signal according to the current measured at the first time to reflect the bonding status between the bonding wire and the semiconductor unit, then providing a second status indicating signal according to the current measured at the second time to reflect the electrical connection status between the bonding wire and the package-connection-means, or the bonding status between the bonding wire and the component electrically connecting the package-connection-means.

The present invention may best be understood through the following description with reference to the accompanying drawings, in which:

DETAILED DESCRIPTION OF THE PREFERRED EMBODIMENTS

Figure 1:
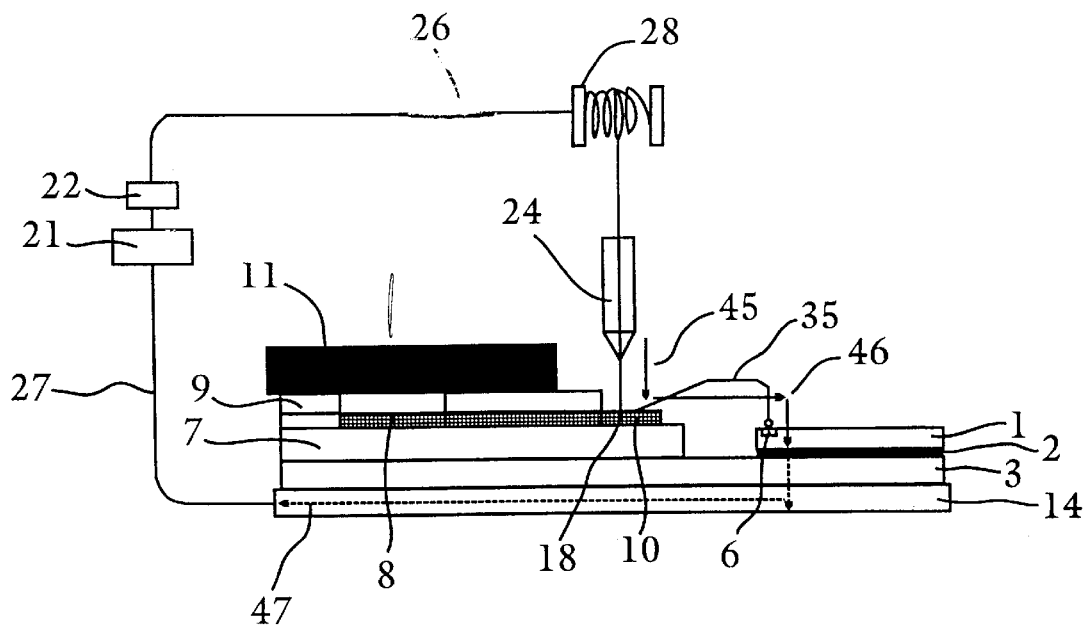
FIG. 1 and FIG. 2 show conventional arts for detecting bonding status of bonding wires during a wire bonding process for packaging a chip.
Figure 2:
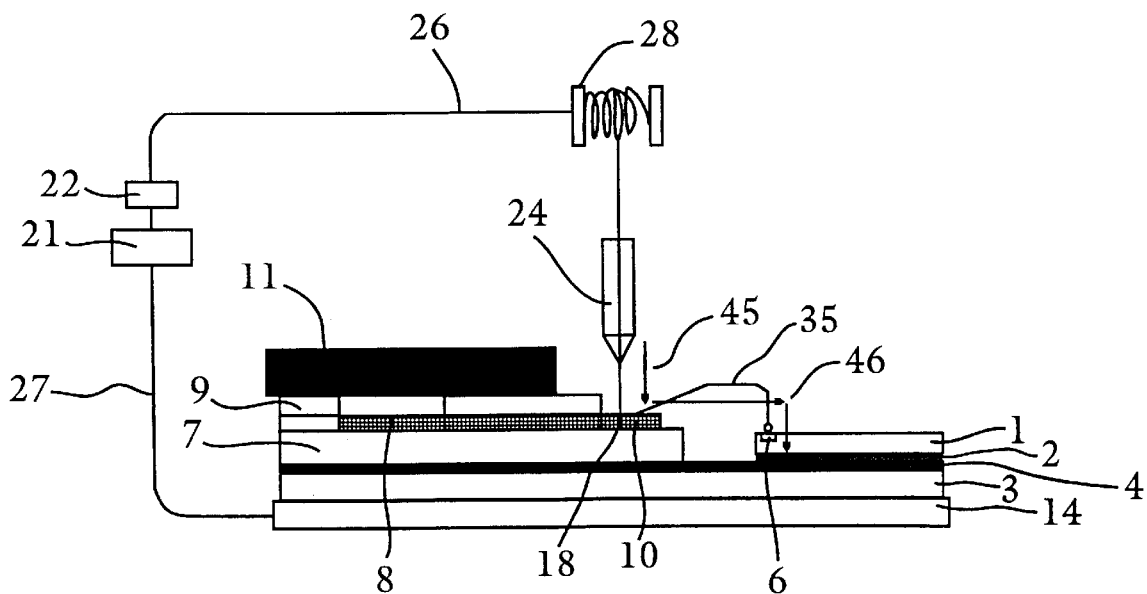
Figure 3:
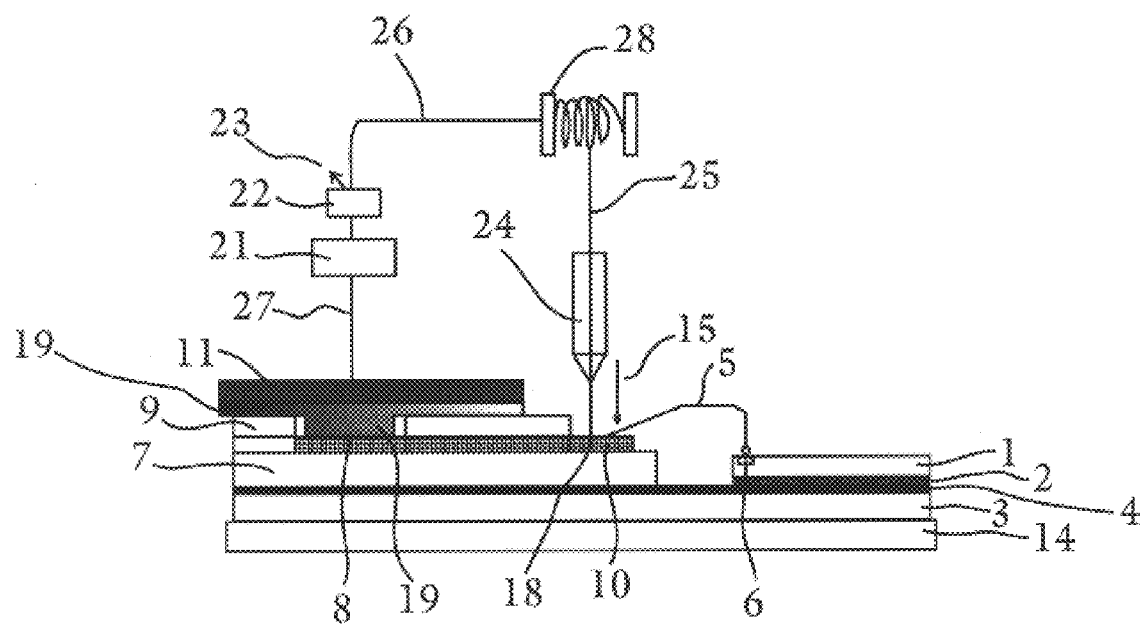
FIG. 3, FIG. 4, and FIG. 5 show some embodiments of the present invention.
Figure 4:
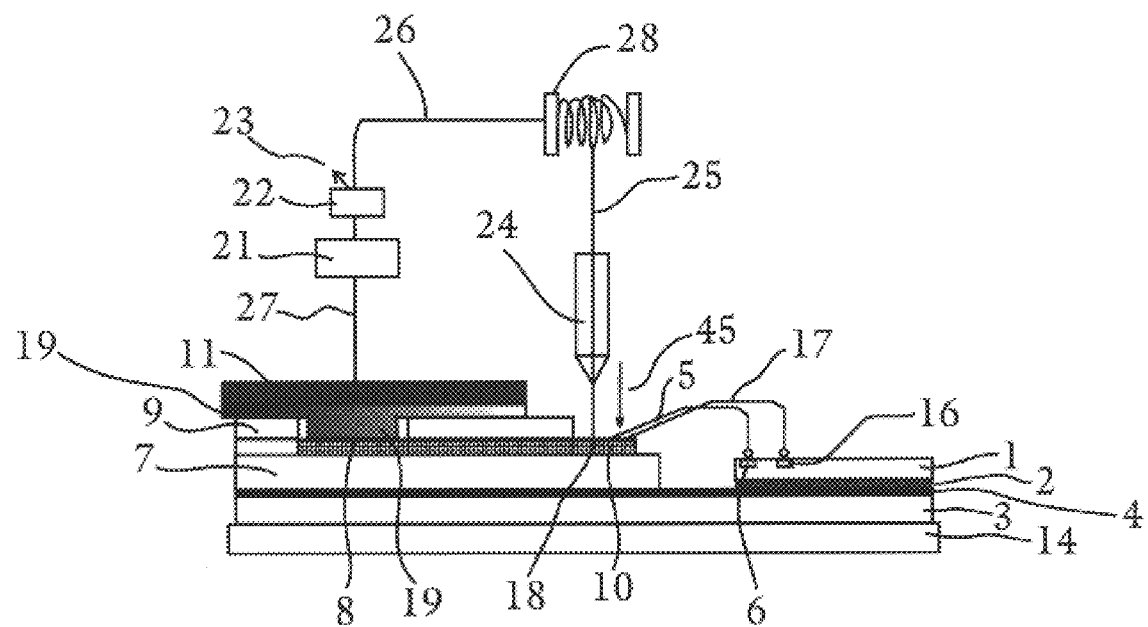
Figure 5:
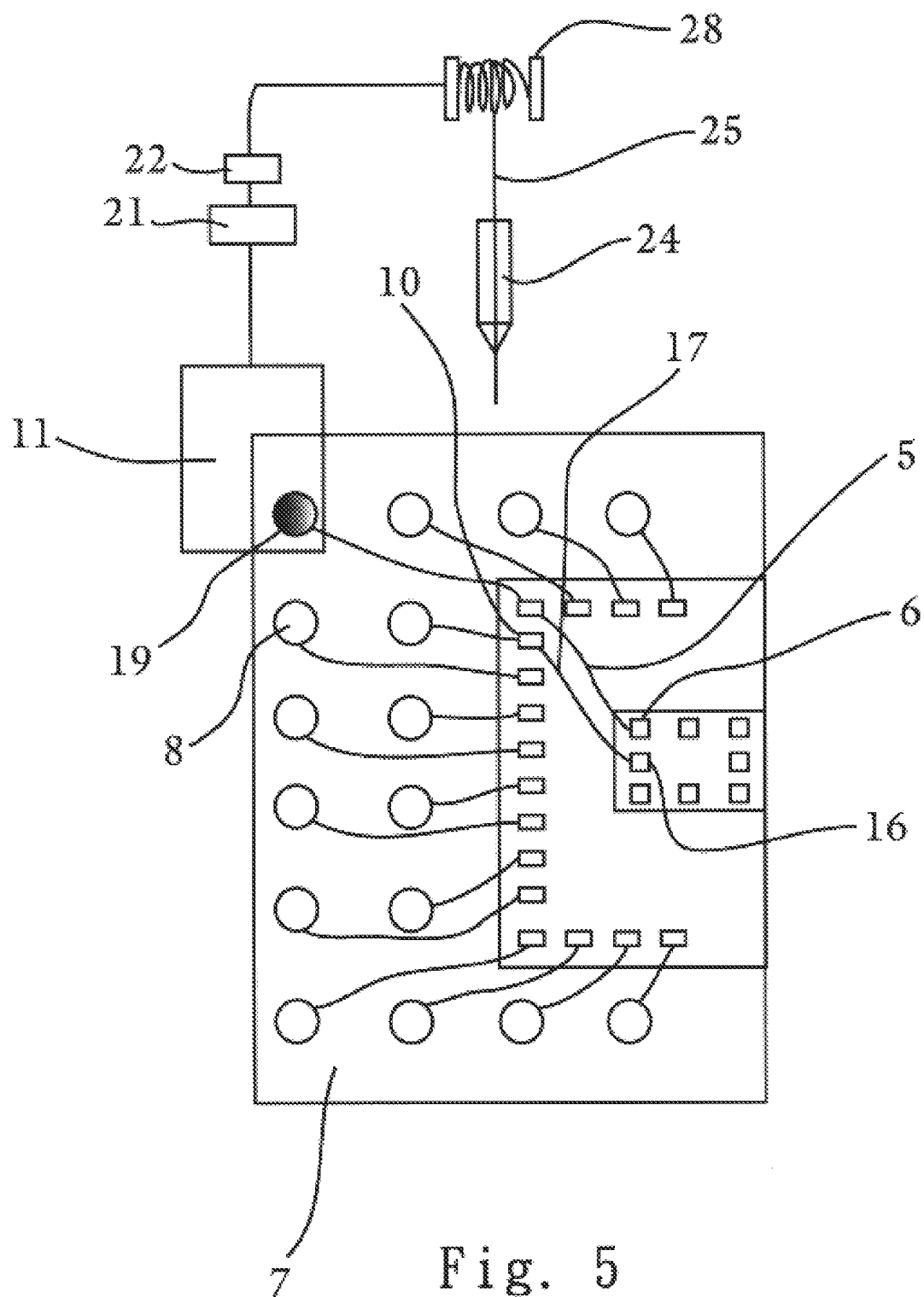

A first embodiment of the present invention is shown in FIGS. 3, 4, and 5. The first embodiment is configured to associate with a wire bonding process or wire bonding machine, for detecting bonding status of a bonding wire of a Ball Grid Array package or similar types of packages including at least a semiconductor unit and at least a solder ball pad (also called package-connection-means in this disclosure). According to the first embodiment, the bonding status of a bonding wire between a semiconductor unit 1 (a chip or die) and a solder ball pad 8 can be detected in spite of the existence of an layer 4 of Cupric Oxide between semiconductor unit 1 and carrier 3. The system embodiment comprises:

- at least a carrier such as a heat dissipater 3 and substrate 7 for supporting the semiconductor unit 1 and the solder ball pads 8 (only one solder ball pad 8 is shown in FIGS. 3 and 4 while a plurality of solder ball pads 8 can be seen in FIG. 5);
- at least an electrical conduction means 19 (an electrically conductive rubber, for example) contacting at least a selected one of the solder ball pads 8;
- at least a preset connection means 5 for electrically connecting (via a bonding finger 10 and a trace 7 of the carrier 7, for example) the selected one of the solder ball pads 8 and a point of the semiconductor unit 1 such as a wire bonding pad 6 corresponding to the selected one of the solder ball pads 8;
- a voltage source 21 enclosed in or independent of a wire bonding machine used for the wire bonding process, for providing an electrical potential difference between the electrical conduction means 19 and a bonding wire 17 (via a press plate 11 used by the wire bonding process, a conductor 26, a bonding wire 25, and the bonding wire remaining in the capillary 24 of the wire bonding machine, for example); and
- a detector 22 enclosed in or independent of the wire bonding machine used for the wire bonding process, for measuring, a current passing the voltage source, and for providing, according to the measured current, at least a status indicating signal reflecting the bonding status of bonding wire 17, i.e., the bonding status between the bonding wire 17 and semiconductor unit 1.

In the first embodiment for detecting bonding status of a bonding wire of a Ball Grid Array package or similar types of packages, the carrier such as 3 or 7 in FIG. 3 may be a substrate, a tape, or a heat dissipater, or their combination, the carrier 3 supporting semiconductor unit 1 is a heat dissipater to which semiconductor unit 1 is attached via adhesion layer 2 and a layer 4 of Cupric Oxide, the preset connection means 5 may include a bonding finger 10 which is on the carrier 7 (a substrate, for example) supporting the solder ball pads 8 and electrically connects the selected one of the solder ball pads 8, thereby the preset connection means 5 electrically connects the selected one of the solder ball pads 8 via bonding finger 10, with part of it being a bonding wire so bonded by the wire bonding process as to electrically connect semiconductor unit 1 and bonding finger 10 (i.e., connected to a wire bonding pad 6 of semiconductor unit 1 and to bonding finger 10, for example), the preset connection means 5 may further include a trace (not shown in figures) lying on carrier 7 and electrically connecting both bonding finger 10 and the selected one of the solder ball pads 8. The voltage source 21 provides an electrical potential difference between the electrical conduction means 19 and bonding wire 25 (still including bonding wire 17) by electrically connecting (via a conductor 26, for example) a bonding wire provider 28 used by the wire bonding process, and the bonding wire 25 contained in capillary 24 used by the wire bonding process, and by electrically connecting (via a conductor 27, for example) a press plate 11 used by the wire bonding process.

As shown in FIGS. 4 and 5, when the wire bonding process completes the bonding of bonding wire 17 (still being part of bonding wire 25) to another wire bonding pad 16 of semiconductor unit 1, a current loop is constituted by conductor 26, bonding wire 25 (still including bonding wire 17), semiconductor unit 1, the preset connection means 5 (may be deemed to include bonding finger 10 and a trace of carrier 7), the selected one of the solder ball pads 8, electrical conduction means 19, press plate 11, conductor 27, and voltage source 21 to form a current passing the voltage source 21; the current shall be small if the bonding status between bonding wire 17 and the wire bonding pad 16 of semiconductor unit 1 is poor, while will be large if the bonding status between bonding wire 17 and the pad 16 of semiconductor unit 1 is good. The detector 22 measures the current passing voltage source 21 to provide a status indicating signal 23 reflecting the magnitude of the current, thereby reflecting the bonding status of bonding wire 17, i.e., reflecting the bonding status between bonding wire 17 and semiconductor unit 1.

A second embodiment of the present invention may also be illustrated by FIGS. 3, 4, and 5 where electrical conduction means 19 contacts all of solder ball pads 8 instead of only the selected one of the solder ball pads 8, the carrier 7 supporting the solder ball pads 8 includes more than one bonding finger 10 each connecting one of the solder ball pads 8. In the second embodiment, voltage source 21 also provides an electrical potential difference between the electrical conduction means 19 and bonding wire 17 by electrically connecting (via a conductor 26, for example) a bonding wire provider 28 used by the wire bonding process, and the bonding wire 25 contained in capillary 24 used by the wire bonding process, and by electrically connecting (via a conductor 27, for example) a press plate 11 used in the wire bonding process. When the wire bonding process completes the bonding of bonding wire 17 (still being part of bonding wire 25) to wire bonding pad 16 of semiconductor unit 1, a current loop is constituted by conductor 26, bonding wire 25 (still including bonding wire 17), semiconductor unit 1, preset connection means 5 (may include bonding finger 10 and a trace of carrier 7), the selected one of the solder ball pads 8, electrical conduction means 19, press plate 11, conductor 27, and voltage source 21 to form a first current passing the voltage source 21 and having its magnitude reflecting the good or poor bonding status of the bonding wire 17, i.e., the good or poor bonding status between bonding wire 17 and semiconductor unit 1 (specifically the wire bonding pad 16 of semiconductor unit 1). Detector 22 measures the first current to provide a first status indicating signal reflecting the magnitude of the first current, thereby reflecting the bonding status between bonding wire 17 and semiconductor unit 1. When the wire bonding process completes the bonding of bonding wire 17 to bonding finger 10, a current loop is constituted by conductor 26, bonding wire 25 (still including bonding wire 17), the bonding finger 10, the solder ball pads 8 which electrically connects the bonding finger 10 directly or via a trace of carrier 7, electrical conduction means 19, press plate 11, conductor 27, and voltage source 21 to form a second current passing voltage source 21 and having its magnitude reflecting the good or poor bonding status between bonding wire 17 and the bonding finger 10. Detector 22 also measures the second current to provide a second status indicating signal reflecting the magnitude of the second current, thereby reflecting the good or poor bonding status between bonding wire 17 and the bonding finger 10. The second current will always be larger than the first current because the second current does not flow through semiconductor unit 1 (semiconductor unit is electrically semi-conductive). Based on these facts, the bonding status between bonding wire 17 and semiconductor unit 1 as well as that between bonding wire 17 and the bonding finger 10 can be respectively detected.

A first method embodiment of the invention which is associated with a wire bonding machine to detect bonding status of at least a bonding wire of a semiconductor package is illustrated hereinafter by referring to FIGS. 3, 4, and 5. The wire bonding machine may include a press plate 11, a capillary 24, or may further include a hot plate 14. The semiconductor package includes at least a semiconductor unit 1 and at least a package-connection-means such as solder ball pads 8, the semiconductor unit 1 and the solder ball pads 8 being supported by at least a carrier such as heat dissipater 3 and substrate 7, with wire bonding pad 6 and 16 of semiconductor unit 1 being exposed. The first method embodiment of the invention comprises the steps of:

selecting at least one of the solder ball pads 8 to be contacted by an electrical conduction means 19;

electrically connecting the semiconductor unit 1 and the selected one of the solder ball pads 8;

letting a press plate 11 of the wire bonding machine contact the electrical conduction means 19;

providing (using a voltage source, for example) an electrical potential difference which exists between the press plate 11 and the bonding wire 17 when the wire bonding machine completes bonding the bonding wire 17 to the semiconductor unit 1;

measuring a current passing the voltage source (or the press plate 11 or bonding wire 17), and providing a status indicating signal according to the measured current to reflect the bonding status between the bonding wire 17 and the semiconductor unit 1.

The electrical conduction means 19 according to the invention may be made of at least one type of material selected from among electrically conductive metal, electrically conductive rubber, and anisotropically conductive film.

According to the invention, the step of electrically connecting the selected one of the solder ball pads 8 and the semiconductor unit 1 comprises a step of electrically connecting the selected one of the solder ball pads 8 and an arbitrary point of the semiconductor unit 1 or a corresponding wire bonding pad which is a wire bonding pad 6 of the semiconductor unit 1 and which corresponds to the selected one of the solder ball pads 8.

For the first method embodiment of the invention, the carrier 7 supporting the selected one of the solder ball pads 8 may include at least a trace (not shown in the figures) and at least a bonding finger 10, each of the solder ball pads 8 connects al least one of the bonding finger 10 via the trace; and the step of electrically connecting the selected one of the solder ball pads 8 and the semiconductor unit 1 includes the step of: bonding a preset connection means 5 by the wire bonding machine between the bonding finger 10 connected to the selected one of the solder ball pads 8, and a corresponding wire bonding pad which is a wire bonding pad 6 of the semiconductor unit 1 and corresponds to the selected one of the solder ball pads 8. The wire bonding machine may further include a voltage source 21 and a bonding wire provider 28, the voltage source 21 providing the electrical potential difference between the press plate 11 and the bonding wire 17, by electrically connecting bonding wire 17 via conductor 26, bonding wire provider 28, and bonding wire 25, and by electrically connecting press plate 11 via conductor 27.

A second method embodiment of the invention which is also associated with a wire bonding machine to detect bonding status of at least a bonding wire of a semiconductor package is also illustrated hereinafter by referring to FIGS. 3, 4, and 5. The second method embodiment of the invention comprises the steps of:

contacting all (instead of only a selected one) of the solder ball pads 8 of the semiconductor package by an electrical conduction means 19; selecting at least one of the solder ball pads 8 to electrically connect the semiconductor unit 1;

letting a press plate 11 of the wire bonding machine contact the electrical conduction means 19;

providing an electrical potential difference which exists between the press plate 11 and the bonding wire 17 when the wire bonding machine completes bonding the bonding wire 17 to the semiconductor unit 1;

measuring a current passing the press plate 11 or bonding wire 17, and providing a status indicating signal according to the measured current to reflect the bonding status between the bonding wire 17 and the semiconductor unit 1.

According to the second method embodiment of the invention, obviously the same or different electrical potential difference may also be so provided to exist between press plate 11 and bonding wire 17 when the electrical connection between the bonding wire 17 and one of the solder ball pads 8 is completed by the wire bonding machine which has bonded the bonding wire 17 to a bonding finger 10 electrically connecting (via a trace of carrier 7, for example) the one of the solder ball pads 8. The current passing press plate 11 or bonding wire 17 are measured twice, one when the wire bonding machine completes the bonding of bonding wire 17 to semiconductor unit 1, and another when the electrical connection between the bonding wire 17 and one of the solder ball pads 8 is completed, i.e., after bonding wire 17 is bonded by the wire bonding machine to the bonding finger 10 that electrically connects the one solder ball pad 8. It can be understood that the status indicating signal may reflect the bonding status between bonding wire 17 and semiconductor unit 1, as well as the electrical connection status between bonding wire 17 and the one of the solder ball pads 8. The detection of electrical connection status between bonding wire 17 and the one of the solder ball pads 8 in such a case can be represented by the detection of the bonding status between bonding wire 17 and the bonding finger 10, because the electrical connection between bonding finger 10 and the solder ball pads 8 is usually inherent in substrate 7.

What is claimed is:

1. A system associated with a wire bonding process, for detecting bonding status of at least a bonding wire of a package including at least a semiconductor unit and at least a package-connection-means, said system comprising:

at least a carrier for supporting said semiconductor unit and said package connection means;

at least an electrical conduction means contacting at least a selected one of said package-connection-means;

at least a preset connection means for electrically connecting the selected one of said connection means and said semiconductor unit;

a voltage source for providing an electrical potential difference between said electrical conduction means and said bonding wire;

a detector for measuring, when said bonding wire is electrically connected to at least one of said semiconductor unit and said package-connection-means, a current passing said voltage source, and for providing, according to the measured current, at least a status indicating signal reflecting the bonding status of said bonding wire.

2. The system according to claim 1 wherein said electrical conduction means is made of at least one selected from among electrically conductive metal, electrically conductive rubber, and anisotropically conductive film.

3. The system according to claim 1 wherein said package-connection-means is solder ball pad.

4. The system according to claim 1 wherein said carrier is made of at least one selected from substrate, tape, and heat dissipater.

5. The system according to claim 1 wherein the carrier supporting said semiconductor unit is a heat dissipater to which said semiconductor unit is attached via adhesive material and cupric oxide.

6. The system according to claim 1 wherein said preset connection means comprises a bonding finger and a preset bonding wire, said bonding finger being on the carrier supporting said package-connection-means, and electrically connecting the selected one of said package-connection-means, said preset bonding wire electrically connecting said bonding finger and said semiconductor unit.

7. The system according to claim 6 wherein said preset bonding wire is bonded, according to said wire bonding process, to said bonding finger and a corresponding wire bonding pad which is a wire bonding pad of said semiconductor unit and which corresponds to the selected one of said package-connection-means.

8. The system according to claim 6 wherein said preset connection means further comprises a trace lying on said carrier and electrically connecting said bonding finger and the selected one of said package-connection-means.

9. The system according to claim 1 wherein said voltage source provides the electrical potential difference between said electrical conduction means and said bonding wire via a press plate connecting said voltage source, and via a bonding wire provider and a bonding wire which is in a capillary and electrically connected to said electrical conduction means, said press plate and said bonding wire provider as well as said capillary all being used in said wire bonding process, said press plate contacting said electrical conduction means.

10. The system according to claim 1 wherein said voltage source electrically connects said bonding wire and a press plate used in said wire bonding process, said press plate contacting said electrical conduction means; and wherein said detector provides said status indicating signal according to the measured current when said wire bonding process completes bonding said bonding wire to said semiconductor unit, said status indicating signal reflecting whether or not the bonding status between said bonding wire and said semiconductor unit is good.

11. The system according to claim 1 wherein said electrical conduction means contacts all of said package-connection-means.

12. The system according to claim 11 wherein said detector provides a first status indicating signal according to the measured current when said wire bonding process completes bonding said bonding wire to said semiconductor unit, said first status indicating signal indicating whether or not the bonding status between said bonding wire and said semiconductor unit is good.

13. The system according to claim 11 wherein the carrier supporting said package-connection-means comprises at least a bonding finger each electrically connecting one of said package-connection-means; and wherein said detector provides a second status indicating signal according to the measured current when said wire bonding process completes bonding said bonding wire to said bonding finger, said second status indicating signal indicating whether or not the bonding status between said bonding wire and said bonding finger is good.

14. The system according to claim 11 wherein the carrier supporting said package-connection-means comprises at least a bonding finger each electrically connecting one of said package-connection-means; and wherein said voltage source electrically connects said bonding wire and a press plate used in said wire bonding process, said press plate contacting said electrical conduction means; and wherein said detector provides a first status indicating signal according to the measured current when said wire bonding process completes bonding said bonding wire to said semiconductor unit, said first status indicating signal indicating whether or not the bonding status between said bonding wire and said semiconductor unit is good, said detector also provides a second status indicating signal according to the measured current when said wire bonding process completes bonding said bonding wire to said bonding finger, said second status indicating signal indicating whether or not the bonding status between said bonding wire and said bonding finger is good.

15. The system according to claim 1 wherein said voltage source and said detector are attached to an apparatus used in said wire bonding process.

* * * * *